(12) United States Patent
Zhang et al.

(10) Patent No.: US 9,280,627 B1
(45) Date of Patent: Mar. 8, 2016

(54) GUI BASED VERIFICATION AT MULTIPLE ABSTRACTION LEVELS

(71) Applicant: Cadence Design Systems, Inc., San Jose, CA (US)

(72) Inventors: David Guoqing Zhang, Fremont, CA (US); Tal Tabakman, Tel Aviv (IL); Yonatan Ashkenazi, Rehovot (IL); Nir Paz, Moshav Gealia (IL); Yochi Bilitski, Elad (IL)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/964,846

(22) Filed: Aug. 12, 2013

(51) Int. Cl.
*G06F 17/50* (2006.01)

(52) U.S. Cl.
CPC .................................. *G06F 17/5045* (2013.01)

(58) Field of Classification Search
CPC .............. G06F 21/445; G06F 21/6218; G06F 2209/5015; G06F 2221/2113; G06F 2221/2149; G06F 8/10; G06F 8/24; G06F 8/30; G06F 8/41; G06F 8/61; G06F 8/63; G06F 8/68; G06F 8/71; G06F 9/443; G06F 9/4843

USPC ................................................... 716/100–108
See application file for complete search history.

(56) References Cited

U.S. PATENT DOCUMENTS

| | | | | |
|---|---|---|---|---|
| 7,409,652 | B1 * | 8/2008 | Fox et al. | 716/106 |
| 8,589,840 | B2 * | 11/2013 | Koizumi | 716/106 |
| 2003/0110464 | A1 * | 6/2003 | Davidson et al. | 716/17 |
| 2004/0143801 | A1 * | 7/2004 | Waters et al. | 716/3 |

* cited by examiner

*Primary Examiner* — Binh Tat
(74) *Attorney, Agent, or Firm* — Kenyon & Kenyon LLP

(57) ABSTRACT

A system and method that implement an object-oriented model for requirements of a hardware design in order to verify the design. The object-oriented model abstractly captures the design topology, capability, control, and status of the design. An object-oriented model or definition of a hardware design is based on one or more specifications or standards implemented with the design. With the object-oriented model, a system and method for storing and displaying data captured during a test run is implemented. Graphical displays are defined to show run information for abstract objects of the design. Predefined graphical displays may be altered to accommodate the features of the object-oriented model and new graphical displays may be defined for objects in the model.

17 Claims, 20 Drawing Sheets

100

200

300

400

510

| Run History Table 800 | | | | | | | |
|---|---|---|---|---|---|---|---|
| SNum 810 | Time 820 | Kind 830 | Owner Definition ID 840 | Owner Instance ID 850 | Owned Definition ID 860 | Owned Instance ID 870 | Value 880 |
| | | | | | | | |
| | | | | | | | |
| | | | | | | | |
| | | | | | | | |
| | | | | | | | |
| | | | | | | | |

GUI BASED VERIFICATION AT MULTIPLE ABSTRACTION LEVELS

BACKGROUND

Aspects of the present invention relate generally to integrated circuit designs, and in particular to techniques for verification and debug of such designs.

Hardware designers, for example integrated circuit (IC) designers, do not always design every component of a new hardware device. While designers may design one or more components of a particular device, they often employ component designs (also known as intellectual property, or IP) from one or more third-party IP providers. Using components from third-party IP providers can facilitate the design by avoiding the need for the designer to design every aspect of the device's functionality.

Hardware designers may employ a hardware based verification platform to perform certain operations on a design. Hardware verification platforms can enable the presentation of real runtime scenarios occurring inside a component. Such presentations can facilitate design analysis and debugging. The designers can perform debugging operations to identify and fix defects that are encountered.

Conventionally, debug solutions involve running a debug program on the source code of the component(s) potentially causing the defect. Alternatively, a verification platform can provide a data dump of information for analysis to identify the cause of a defect. However, because many modern hardware devices utilize numerous components from multiple IP providers, simulating or stepping through the source code of every component to debug the design, or shifting through a data dump representing simulation information for the device components may not be feasible. Additionally, the source code of third-party components may be proprietary and inaccessible to a debug program.

Multiple aspects of the hardware typically may be tested during debug. For example, a hardware design may undergo architectural simulation and analysis and debugging where the functionality of each of the components being implemented in the design is tested, for example, with transaction level modeling (TLM) or bus functional modeling. The hardware design may additionally undergo circuit simulation and analysis where the signals between components are tested, for example using register transition level (RTL) analysis. Other steps may include system simulation, for example to model the components of a system together, and system and software emulation, for example to model execution of software elements executing on a modeled system. Each of these debugging methods typically utilizes different verification platforms and/or different interface tools, therefore there is limited crossover between verification methods and almost no reuse of tools or generated information across the different aspects of the verification process.

Accordingly, there is a need in the art for a system to efficiently debug and analyze components of a hardware design without accessing the source code of the components or other confidential or proprietary information. Additionally, there is a need in the art for a system that provides access to multiple aspects of the verification process within a single platform.

BRIEF DESCRIPTION OF THE DRAWINGS

The foregoing and other aspects of various embodiments of the present invention will be apparent through examination of the following detailed description thereof in conjunction with the accompanying drawing figures in which similar reference numbers are used to indicate functionally similar elements.

FIG. 8 illustrates an exemplary history table according to an embodiment of the present invention.

FIG. 11 illustrates an exemplary interface displaying a log view according to an embodiment of the present invention.

DETAILED DESCRIPTION

Aspects of the present invention describe an object-oriented approach to verifying a hardware design that abstractly captures the design topology, capability, control, and status of the design. An object-oriented model or definition of a hardware design is based on one or more specifications of the design independent from the design implementation. The verification content expressed with the proposed object-oriented model may be used throughout the design development and verification cycles, as well as post-silicon device validation, thereby providing complete and consistent specification knowledge throughout the life of the design development. The object-oriented model will then be available for use with every level and phase of design in the hardware design cycle. With the object-oriented model, a system and method for storing and displaying data captured during a test run is implemented. Graphical displays are defined to show run information for abstract objects of the design rather than test result displays based on the specific design and/or source code.

The abstract verification concepts referenced in this application are described in more detail in U.S. patent application Ser. No. 13/929,277 filed on Jun. 27, 2013; that application is incorporated in this application in its entirety.

Figure 1:
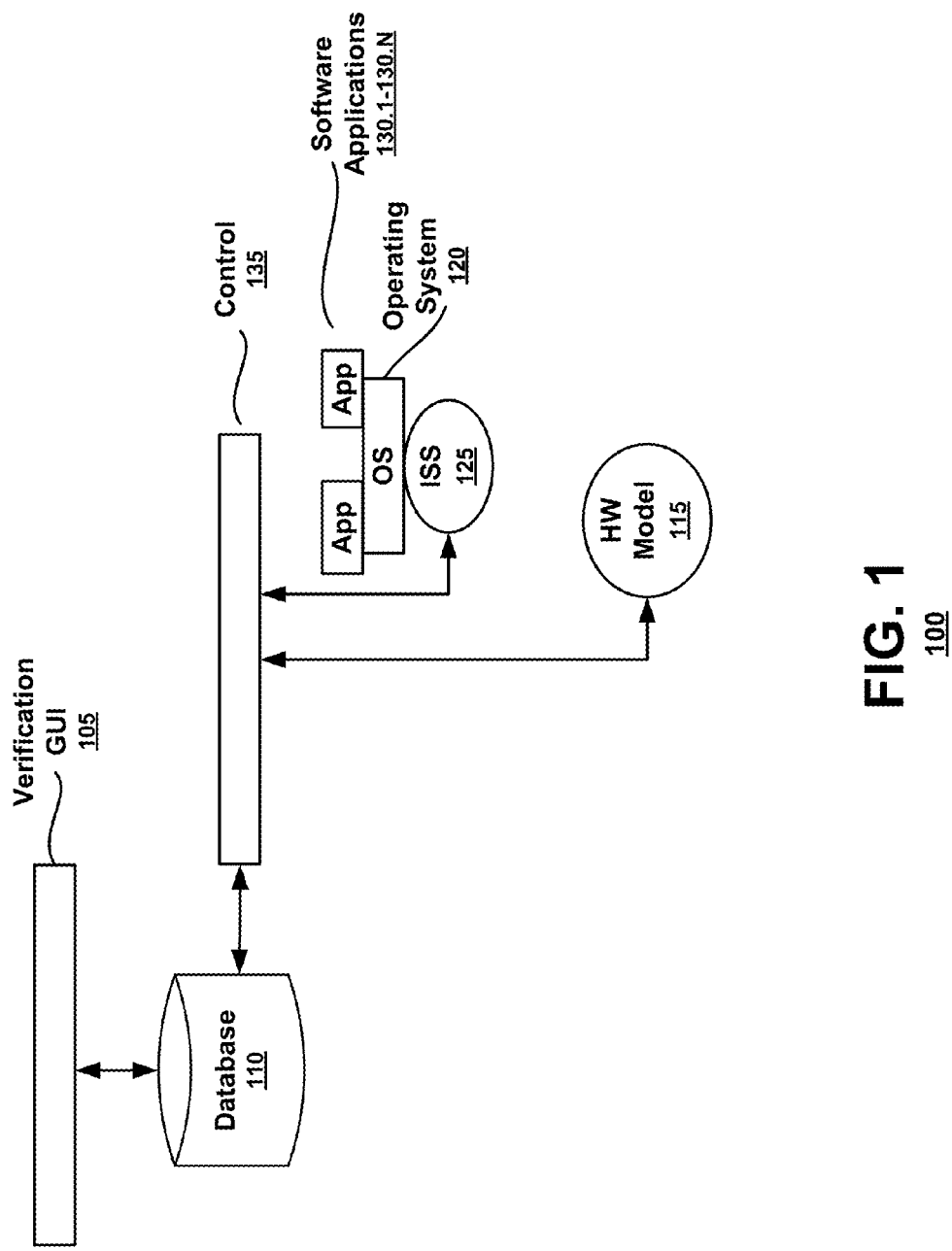
FIG. 1 illustrates an exemplary verification platform according to an embodiment of the present invention.

FIG. 1 illustrates an exemplary verification platform 100 according to an embodiment of the present invention. In FIG. 1, a verification interface 105, in one embodiment, a graphical user interface (GUI), is implemented to provide control and observability for the components of the verification platform 100. The verification interface 105 may be any interface that allows a user access to and/or control over the components of the verification platform. For example, although shown as a GUI in FIG. 1, the verification interface 105 may also be implemented as a scripting and/or text-based interface. As shown in FIG. 1, the verification interface 105 is connected to or otherwise has access to a database 110. The database 110 is designed to store debug objects and to provide verification information to the verification interface 105.

The verification platform 100 may facilitate simulation, testing, debug, post-silicon, emulation of hardware components, or any other phase of hardware design. For example, in FIG. 1, hardware components are simulated as one or more hardware models 115. Similarly, embedded software applications, operating systems, or other bare hardware elements can be simulated on the verification platform 100. An operating system (OS) 120 may be simulated with reference to an instruction set simulator (ISS) 125 modeling a processor instruction set. Then one or more software applications 130.1-130.N running on the OS can be executed as necessary to ensure complete verification of a hardware design. The verification of the hardware design may be executed or controlled by a controller 135.

Figure 2:
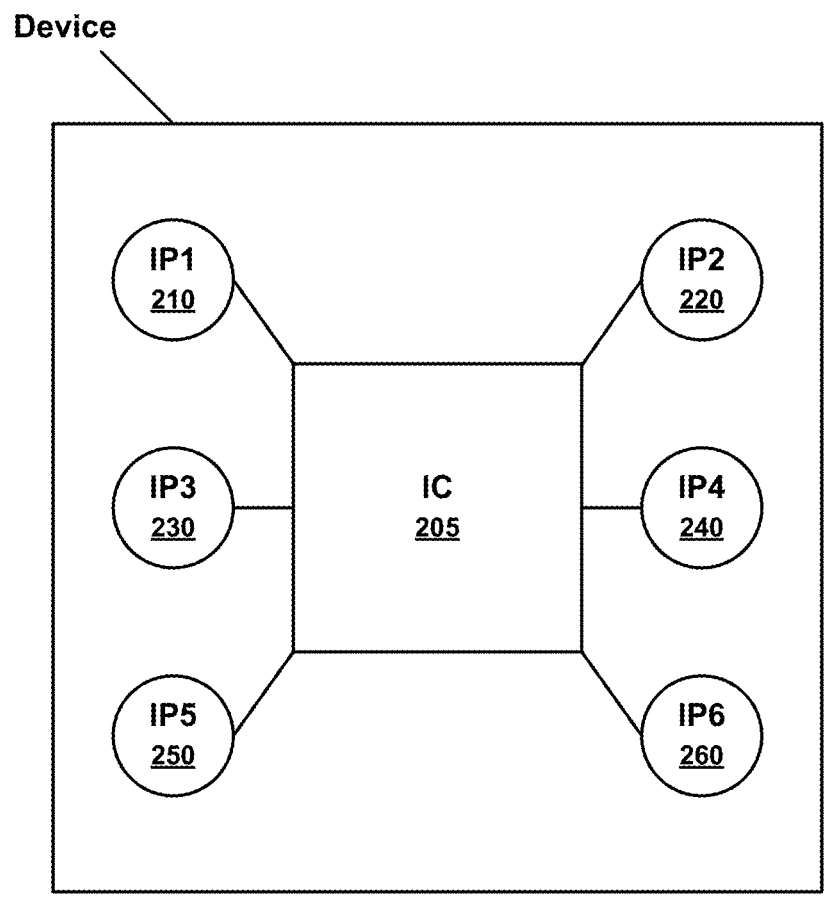
FIG. 2 is a simple block diagram illustrating an exemplary hardware design that may be tested with the verification platform according to an embodiment of the present invention.

FIG. 2 is a simple block diagram illustrating an exemplary hardware design 200 that may be tested with the verification platform according to an embodiment of the present invention. The hardware design 200 may be a design for any hardware component or device, for example a mobile phone (including but not limited to a smartphone), a tablet, or a computer of some kind. The device includes one or more ICs 205 with IP design components IP1-IP6 210-260. For example a smartphone could include multiple IP design components such as memory (static or dynamic, general-purpose or special-purpose); graphics processing; audio; video; power management; various wired communication and/or bus protocols including but not limited to PCI Express, members of the PCI Express family, and/or variants thereof, in different applications depending on the data communications need; wireless communications protocols including but not limited to cellular (e.g. GSM/CDMA), Bluetooth™, Wi-Fi (some form of 802.11), WIMAX (some form of 802.16); various connection protocols including but not limited to different forms of USB (different versions, micro-USB, mini-USB, and the like), video connection protocols (e.g. Thunderbolt (which might be one example of a PCI Express application), HDMI, or others) or other connector types which may or may not be proprietary; and/or image processing (e.g. on-board camera functionality). All of these various elements could be provided in a single design (for example, in a system on a chip (SoC), or other design incorporating IP from multiple providers, or multiple types of IP from a single provider), or could be contained in multiple designs.

While some of the IP design components mentioned above may be proprietary, a number of them may be developed according to a standard, be it wired or wireless communications, audio, video, memory, or others. Different IP providers can and will have different ways of implementing a particular standard. Some of these IP design components may interrelate and/or interoperate. That is, some of these components may rely on performance of other components in order to function properly. For example, graphics processing may rely on special purpose graphics memory, or additionally may rely on some portion of general purpose memory in order to perform in an optimal manner.

It should be noted that there may be portions of a standard for which compliance is mandatory, and other portions for which compliance is optional. The hardware designer may have a particular feature set in mind, in which compliance either with only mandatory portions of the standard, or with mandatory and certain optional portions of the standard, would be necessary.

Where a standard such as Bluetooth™, Wi-Fi, other communications, memory management, display, or other functionality in a device is implicated, verification may include showing compliance with the standard. Where the functionality in question is the result of proprietary third party IP which does not necessarily follow a particular standard, the IP provider may disclose an interface definition or custom protocol, without the IP provider revealing its proprietary information. The standards or provided definitions may then be utilized by the verification platform to show that the components of the design execute properly or to otherwise identify errors.

Figure 3:
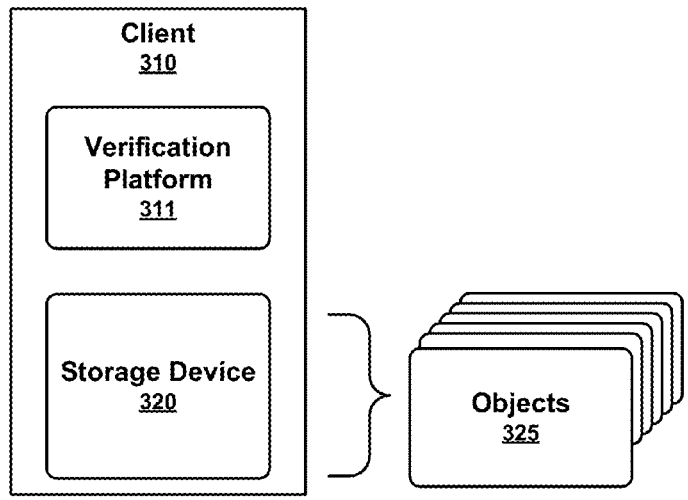
FIG. 3 is a simple block diagram illustrating components of an exemplary system according to an embodiment of the present invention.

A user may access a verification platform in a standalone client system, client-server environment, or a networked environment. FIG. 3 is a simple block diagram illustrating components of an exemplary system 300 according to an embodiment of the present invention. As shown in FIG. 3, a system 300 may comprise a client 310 executing a verification platform 311 and having a memory storage 320. The client 310 may be any computing system that executes a verification platform 311 or otherwise facilitates access to memory storage 320, for example a personal computer. The client 310 may include a processor that performs a method in accordance with the disclosed embodiments. Such a client would be part of an overall verification system in accordance with the disclosed embodiments.

Hardware designs, instruction sets, software packages, instances of modeled components, interface definitions, and other objects 325 used by the verification platform 311 may be stored in memory storage 320. A user may access the objects 325 stored in memory storage 320 with the client 310 via the verification platform 311, where the verification platform 311 is capable of accessing memory storage 320 and displaying the objects 325 and the data associated with the verification. The verification platform 311 may include a user interface, for example a program, application or middleware that acts as a frontend to and facilitates access to objects in memory storage 320. The verification platform 311 may facilitate verification of the components in a hardware design using the display and edit tools and procedures described herein. The user may interact with the verification platform 311 through a number of input devices, such as by inputting a selection as with a mouse or inputting a request as with a keyboard. The user may observe the verification results on an output device or display. The verification platform 311 may run in an application window controlled by the user.

Memory storage may include a file system, hard drive, database, or any other method of storing data. According to an embodiment, multiple memory storage devices may be implemented (not shown). For example, design storage may contain the hardware design and related information and a separate verification database may contain interface definitions and other objects used to run verification tests on a hardware design.

As shown in FIG. 3, a client 310 may be a stand-alone system, as may be of particular interest where the design being verified is confidential. Additionally, according to an aspect of an embodiment as shown in FIG. 4, a client 410 may be part of a networked environment.

Figure 4:
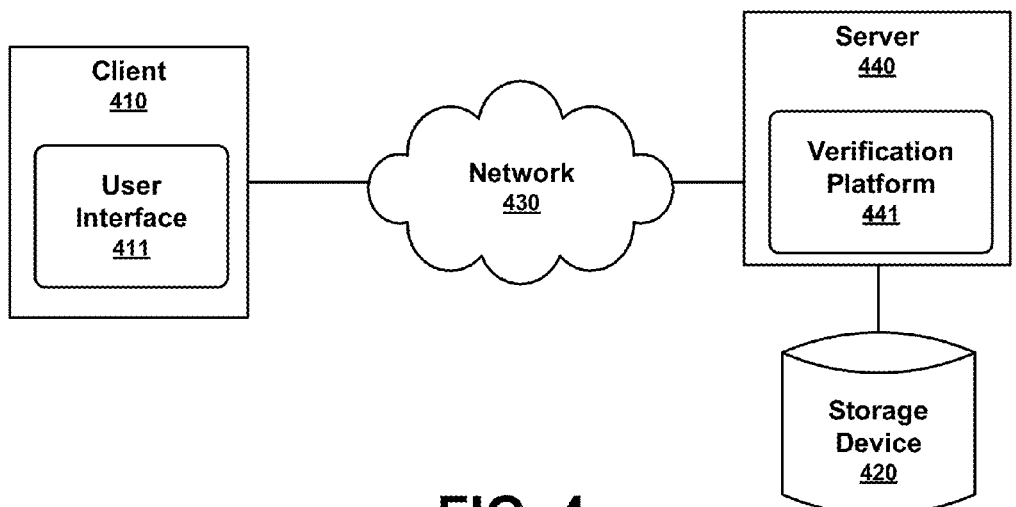
FIG. 4 is a simple block diagram illustrating components of an exemplary system according to an embodiment of the present invention.

FIG. 4 is a simple block diagram illustrating components of an exemplary system 400 according to an embodiment of the present invention. As shown in FIG. 4, system 400 may include a client 410 having a user interface 411. The client 410 may be connected to a server 440 via a network 430. The verification platform 441, which in this embodiment is located at server 440, may have access to storage device 420 storing hardware designs, instruction sets, software packages, instances of modeled components, interface definitions, and other objects utilized by the verification platform 441. The server 440 may include a processor that performs a method in accordance with the disclosed embodiments. Such a server then would be part of an overall verification system in accordance with the disclosed embodiments.

A user may access a verification platform 441 at the server 440 via the client 410 having a user interface 411 capable of accessing and displaying the components implemented as part of a hardware design and the results of the verification of those components. The client 410 may be any computing system that facilitates the user accessing storage device 420, for example a personal computer. The network 430 may be a wired or wireless network that may include a local area network (LAN), a wireless area network (WAN), the Internet, or any other network available for accessing storage device 420 from the client 410.

The server 440 may be a network server accessible to the client 410 via the network 430 that may manage access to storage device 420. The user interface 411 may receive instructions regarding verification of a design from the user and utilizing the objects stored in memory storage 420, facilitate a display of the verification or the information gathered during the verification. Multiple different clients (not shown) may access storage device 420 via the network 430 and request access to the objects stored therein.

In another networked environment, the verification platform may be executed on a network capable client and access the designs, packages and other objects stored in one or more storage devices via a network and communications server.

Figure 5:
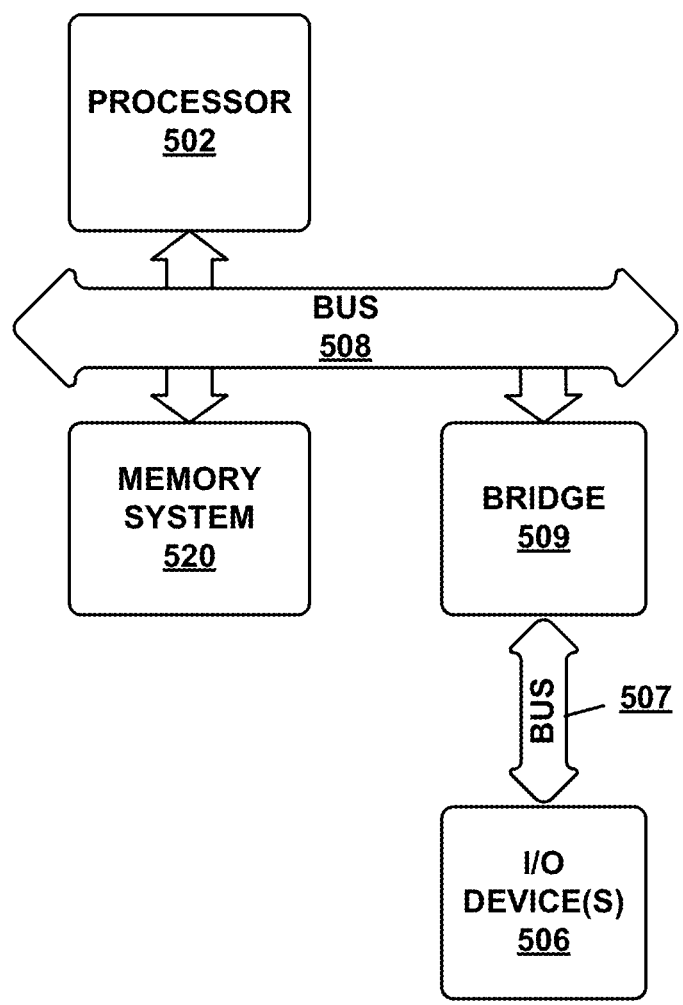
FIG. 5 is a simple block diagram illustrating components of an exemplary client according to an embodiment of the present invention.

FIG. 5 is a simple block diagram illustrating components of an exemplary client 510 according to an embodiment of the present invention. As shown in FIG. 5, the client 510 configured to execute the verification platform as described herein may include a processor 502, a memory system 520 and one or more input/output (I/O) devices 506 in communication. The communication can be implemented in a variety of ways and may include one or more computer buses 507, 508 and/or bridge devices 509 as shown in FIG. 5. According to an aspect of an embodiment, the I/O devices 506 can include network adapters and/or mass storage devices from which the client 510 can receive commands for executing the phases of verification.

As shown in FIG. 3, a client 510 may be a stand-alone system, as may be of particular interest where the components being simulated are confidential. Additionally, according to an aspect of an embodiment as shown in FIG. 4, a client 510 may be part of a networked environment.

Figure 6A:
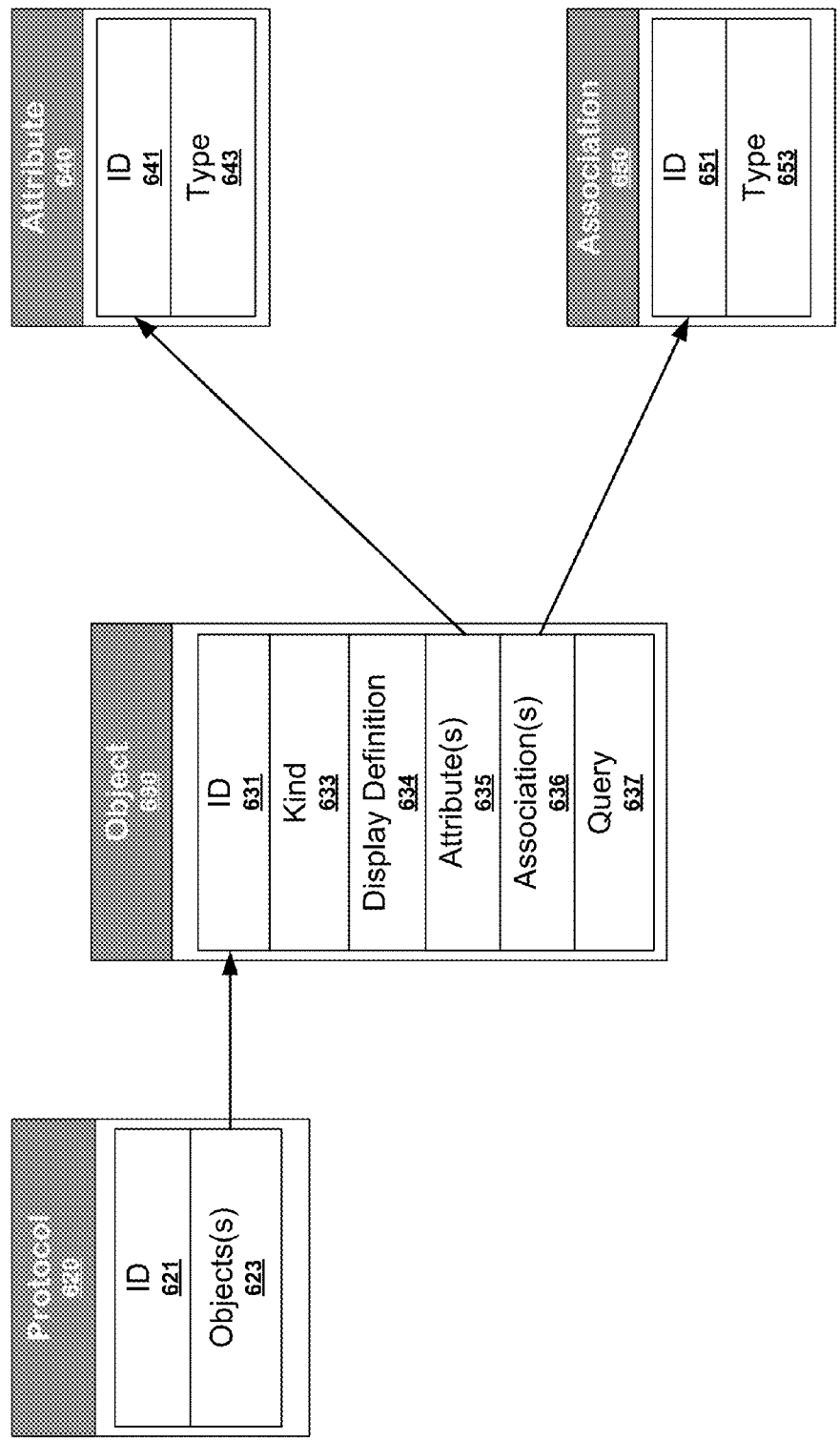
FIG. 6A illustrates exemplary records for definition of objects of an abstract verification according to an embodiment of the present invention.

FIG. 6A illustrates exemplary records for definition of objects of an abstract verification according to an embodiment of the present invention. As shown in FIG. 6A, a protocol definition 620 includes a protocol identifier 621 and links to objects defined to test the protocol 623. An object definition 630 may include an object identifier 631, an object type 633, an associated display definition 634, attributes of the object 635, associations of the object 636, and queries defined for the object 637. The object identifier 631 may identify a type of object for which there may be implemented several instances in a design. An attribute record 640 may include an attribute identifier 641 and an attribute type 643. Similarly, an association record 650 may include an association identifier 651 and an association type 653.

The associations of an object provide details that define the relationships between objects. For example, a Command Queue object will be associated with one or more Command objects. Additionally, associations between objects may facilitate runtime attribute updates. For example, an object representing a finite state machine with an attribute 'state' may be associated with an object representing a signal simulated in the hardware design that indicates the state of the finite state machine. Then when the signal changes during runtime, the attribute of the finite state machine object similarly changes.

The queries for an object provide default questions about the context of the object. A query contains information about debug actions that may take place and provides hints or heuristics for optimizations for storing and accessing debug information stored in a database. For example, a Command Queue object may have pre-defined queries such as "show the histogram of the queue size" or "show all the moments the queue is full". These default queries provide a method to pull information relevant to the object from memory storage, for example, with a database query. A hardware designer or IP provider may additionally define or provide custom queries for the object. Custom and default queries may additionally provide hints or information about how to use the object and its attributes and associations. For example, the query may indicate that certain associations are meaningful for polling and displaying information during debug activities. Or the query may include information that facilitates efficient storage and retrieval of data collected during a test run.

Once the objects for a standard have been defined, they may be utilized during any stage of the design verification process. For example, the object-oriented definition of the standard may be used during architectural development to confirm that the component interconnections represented by associations between objects conform to the standard. Similarly, the object oriented definition of the standard may be used during component simulation, system emulation, debugging, or post-silicon analysis to confirm that the components of the design conform to the standard during execution.

Figure 6B:
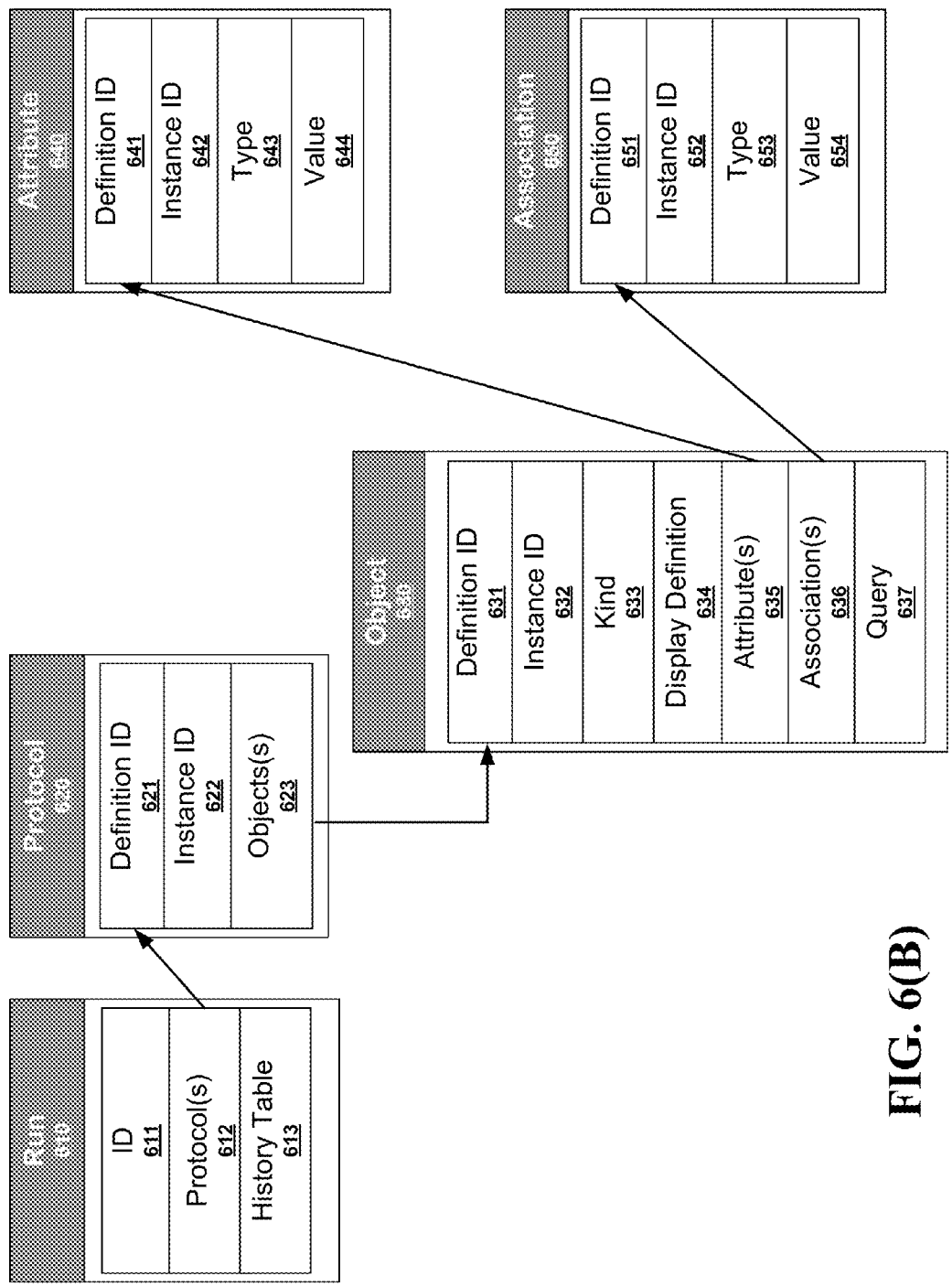
FIG. 6B illustrates exemplary records for an instance of an abstract verification according to an embodiment of the present invention.

FIG. 6B illustrates exemplary records for an instance of an abstract verification according to an embodiment of the present invention. In FIG. 6B, a first record 610 holds the information for a specific run of the verification and test. The run information includes a unique run identifier 611, links to the protocols being tested in the run 612, and a history table 613 that stores information about the specific events that occurred in the run.

As shown in FIG. 6B, a protocol record 620 implementing an instance of the defined protocol includes a protocol definition identifier 621, a protocol instance identifier 622, and links to object instances implemented to test the protocol 623 for the specific design. An object record 630 may include an object identifier 631 which will identify the definition for the object, a unique instance identifier 632, an object type 633, an associated display definition 634, attribute instances of the object 635, association instances of the object 636, and query instances defined for the object 637. The object identifier 631 may reference the definition of the object as defined in the protocol whereas the instance identifier 632 may reference a specific instance of the object type implemented in a specific run. An attribute record 640 may include an attribute definition identifier 641, a unique instance identifier 642, an attribute type 643, and an attribute instance value 644. Similarly, an association record 650 may include an association definition identifier 651, a unique instance identifier 652, an association type 653, and an association instance value 654.

Figure 6C:
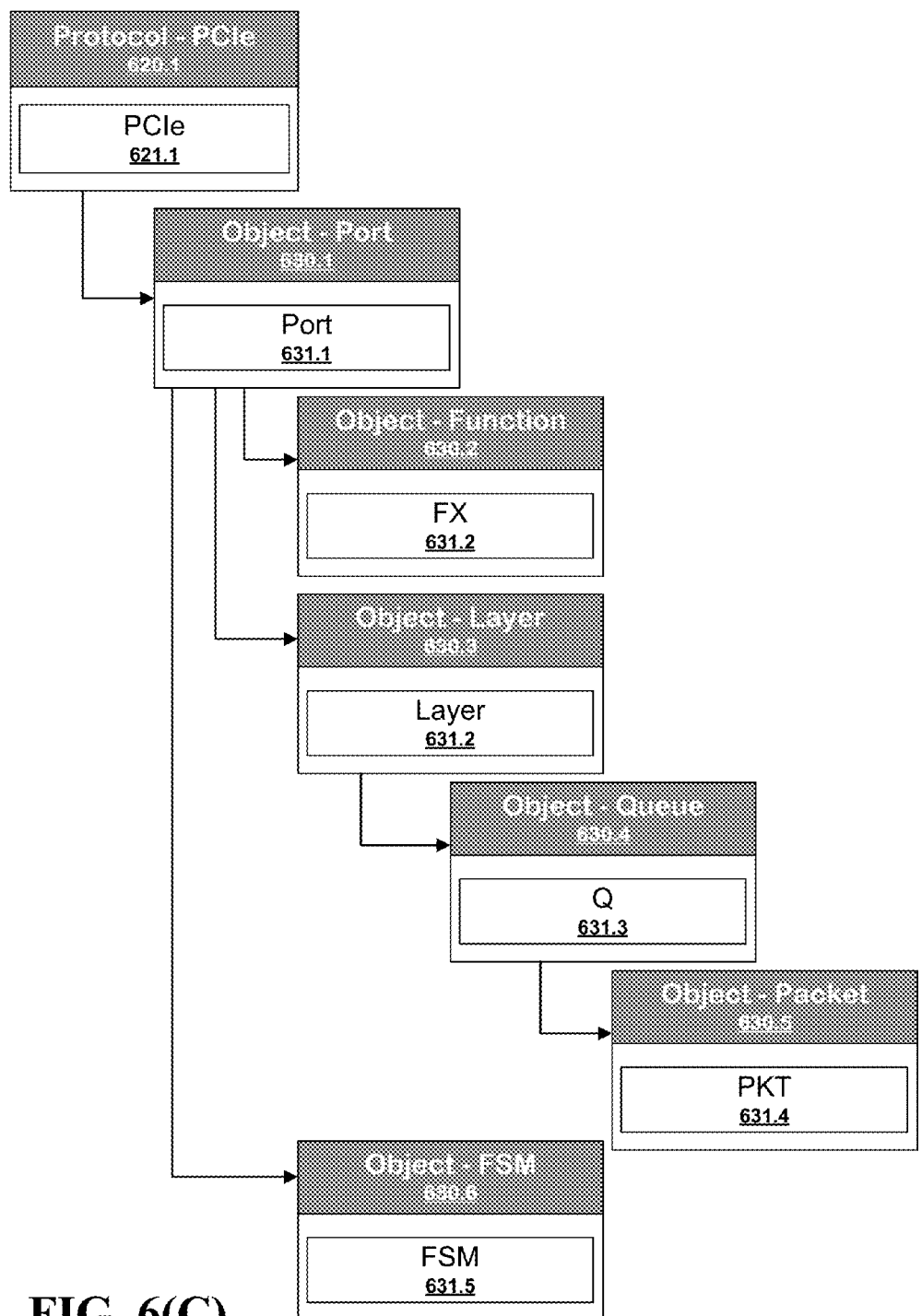
FIG. 6C illustrates an exemplary protocol definition according to an embodiment of the present invention.

FIG. 6C illustrates an exemplary protocol definition according to an embodiment of the present invention. For example, a protocol definition 620.1 may be implemented for a PCI Express (PCIe) protocol. Then one or more objects may be associated with the protocol. As shown in FIG. 6C, the PCIe protocol definition may include a port object 630.1 with a definition ID of Port 631.1 implemented to test a design operates according to the protocol. Then the port object 630.1 defines an object of type port for the protocol. In the definition of the port, the port object 630.1 may be associated with additional objects. In FIG. 6C, the port object 630.1 is associated with a function object 630.2 with a definition ID FX 631.1, a layer object 630.3 with a definition ID Layer 630.3, and a finite state machine (FSM) object 630.6 with a definition ID FSM 631.6. Additionally, the layer object 630.3 is associated with a queue object 630.4 with a definition ID Q 631.4, and the queue object 630.4 is associated with a packet object 630.5 with a definition ID PKT 631.5. Each of these objects will be defined as indicated above with respect to FIG. 6A.

Figure 6D:
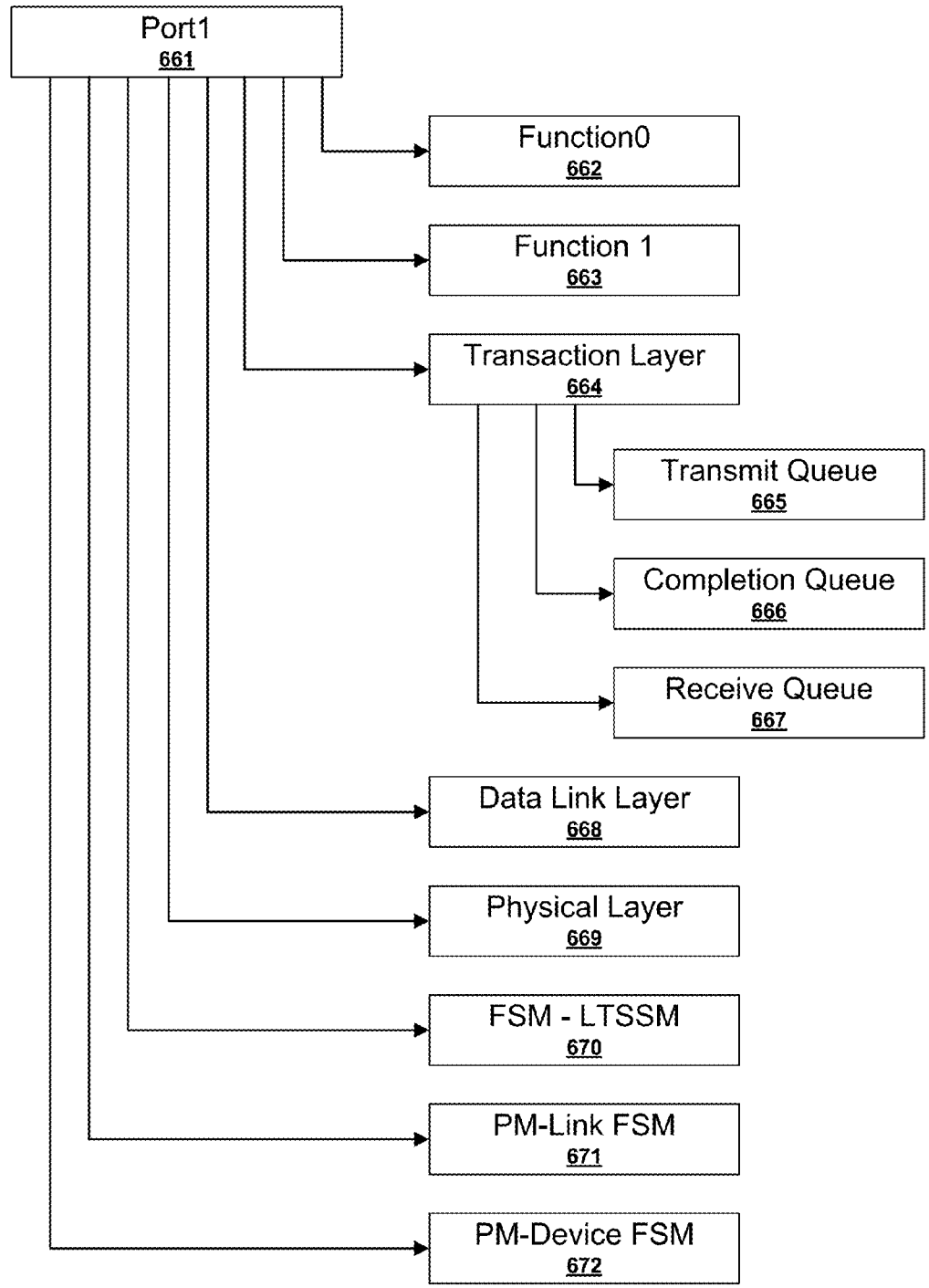
FIG. 6D illustrates exemplary object instances statically associated with a design implementing a protocol according to an embodiment of the present invention.

FIG. 6D illustrates exemplary object instances statically associated with a design implementing a protocol according to an embodiment of the present invention. With reference to the protocol definition shown in FIG. 6C, the definition may be implemented as shown in FIG. 6D for a design. In FIG. 6D, a port object 630.1 with instance ID Port1 661 and definition ID Port 631.1 is associated with several additional objects implemented according to their respective definitions, including: function objects 630.2 with instance IDs Function0 662 and Function1 663 and each with definition ID FX 631.2; layer objects 630.3 with instance IDs Transaction Layer 664, Data Link Layer 668, and Physical Layer 669 and each with definition ID Layer 631.3; and FSM objects 630.6 with instance IDs FSM-LTSSM 670, PM-Link FSM 671, and PM-Device FSM 672 and each with definition ID FSM 631.6. Additionally, the Transaction Layer is associated with queue objects 630.4 with instance identifiers Transmit Queue 665, Completion Queue 666, and Receive Queue 667, each with definition ID Q 631.4. Then during the run, the values and attributes of each of these objects may be updated and the updates stored in a history table for the run.

Figure 6E:
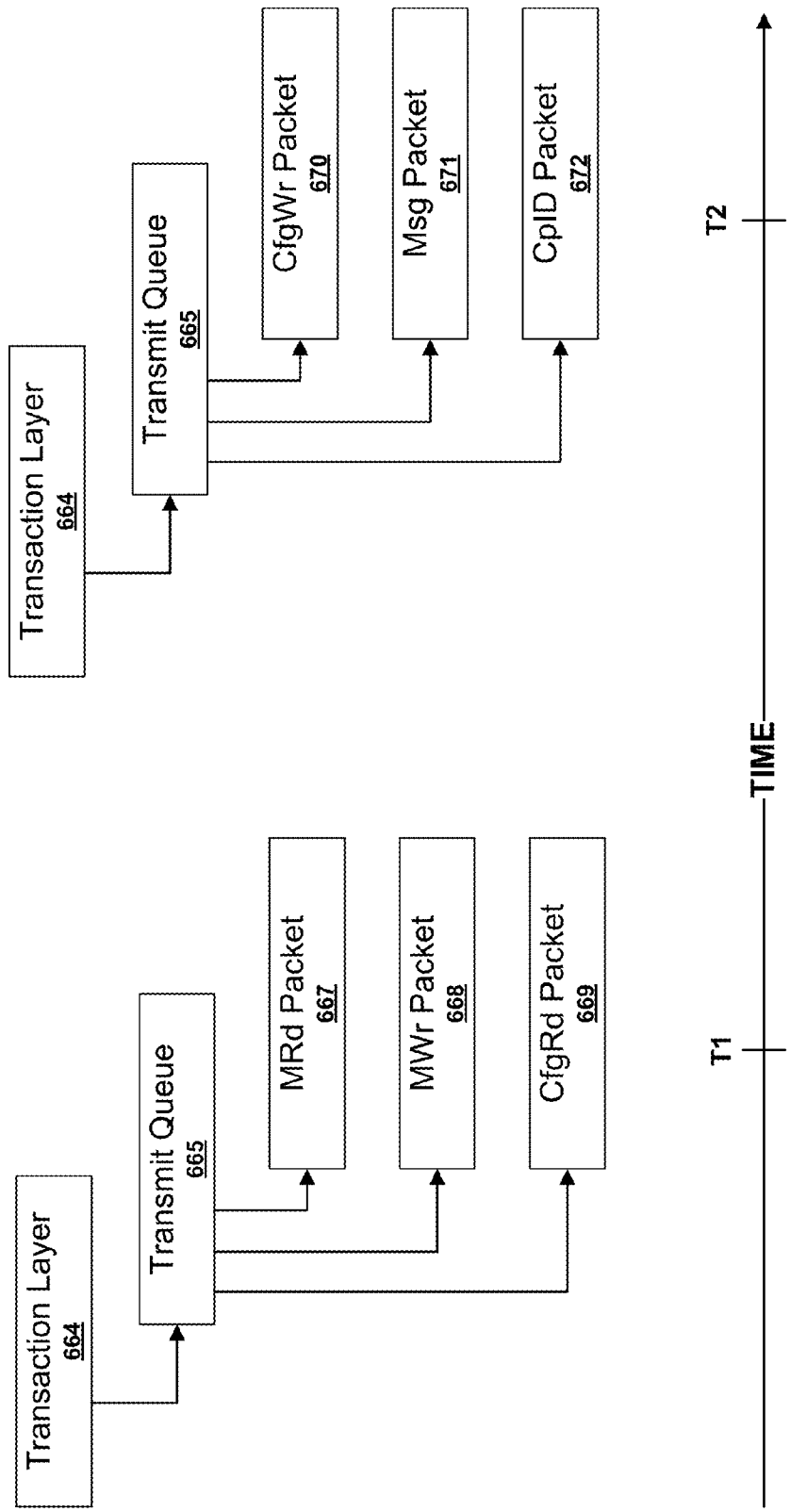
FIG. 6E illustrates exemplary object instances dynamically associated with a design implementing a protocol according to an embodiment of the present invention.

FIG. 6E illustrates exemplary object instances dynamically associated with a design implementing a protocol according to an embodiment of the present invention. With reference to the protocol definition shown in FIG. 6C and the static associations shown in FIG. 6D, the definition may be implemented as shown in FIG. 6E for a design. Consistent with FIG. 6D, the Transaction Layer 664 is associated the Transmit Queue 665. As shown in FIG. 6E, the associations for the Transmit Queue 665 object may be updated dynamically during run time as packets are input into and output from the queue. Therefore, at time T1, Transmit Queue 665 holds several packet objects 630.4 with instance identifiers MRd Packet 667, MWr Packet 668, and CfgRd Packet 669, each with definition PKT 631.5. Then, at time T2 during the run, Transmit Queue 665 holds several packet objects 630.4 with instance identifiers CfgWr Packet 670, Msg Packet 671, and CpID Packet 672, each with definition PKT 631.5. The changes in association may additionally be stored in a history table for the run.

As will be understood, FIGS. 6A-6E show only a limited number of exemplary objects and records implemented to test a design. However, a design will typically have many more instantiated objects and a protocol will typically have many more defined objects. Additionally, the identifiers and definition records are exemplary only and may be altered depending on the implementation.

Multiple levels of abstraction are available with the described verification platform and verification objects. For example, the verification platform has been described herein as providing an object oriented definition of one or more standards or protocols. However, additional objects may be defined. Elements of the source code of one or more IP components may be represented using an abstract object-oriented definition. Then, a source code object, e.g., a variable defined as a signal input into the IP component, may be associated with a protocol object, e.g., an input to the component, thereby tying the verification of the protocol to the execution of the source code. A third party IP designer may provide a definition of the variables and objects corresponding to files, lines, variables, etc., in the design source without providing access to the source code itself. Then, using objects created based on the provided definition, the verification platform can utilize the custom definition to perform verification and debug tasks.

By providing a definition of the protocols, and then creating an abstract representation of a hardware design using the definition, a test platform can execute verification tools and track and display the verification results for all designs and defined protocols regardless of the complexity of the hardware design, the protocol being implemented (e.g. PCI Express), the semantics of the implementing language (e.g. C, Verilog, etc.), and regardless of the representation of the hardware design (e.g. TLM, RTL, FPGA, etc.). Thus a storage and display system may be implemented that is applicable to all stages of the verification.

A display definition holds hints about how to display the associated object. The display definition may be part of a protocol or object definition as shown in FIG. 6B, may be created when the verification GUI or debug tool is launched, the display definition may be defined and edited during the verification process through a GUI, or may be defined in an additional manner. For example, the display definition may be an XML file or other predefined structured file used to create a graphical user interface (GUI). For example, for a queue object, a display definition could include instructions that the object should allow using the histogram display type with the attributes of the queue object, and more specifically that a histogram display type should show the association of the queue with packets. Similarly, for a finite state machine (FSM) object, the display definition could include instructions that the object should allow using the state machine display type and could also include a description of the different states within the FSM as well as the edges between the states. Display definitions may additionally include instructions on what is to be included in a display and how items should be displayed, e.g., the location of the item on the screen, the size of the item, the font, the color, etc.

Figure 7:
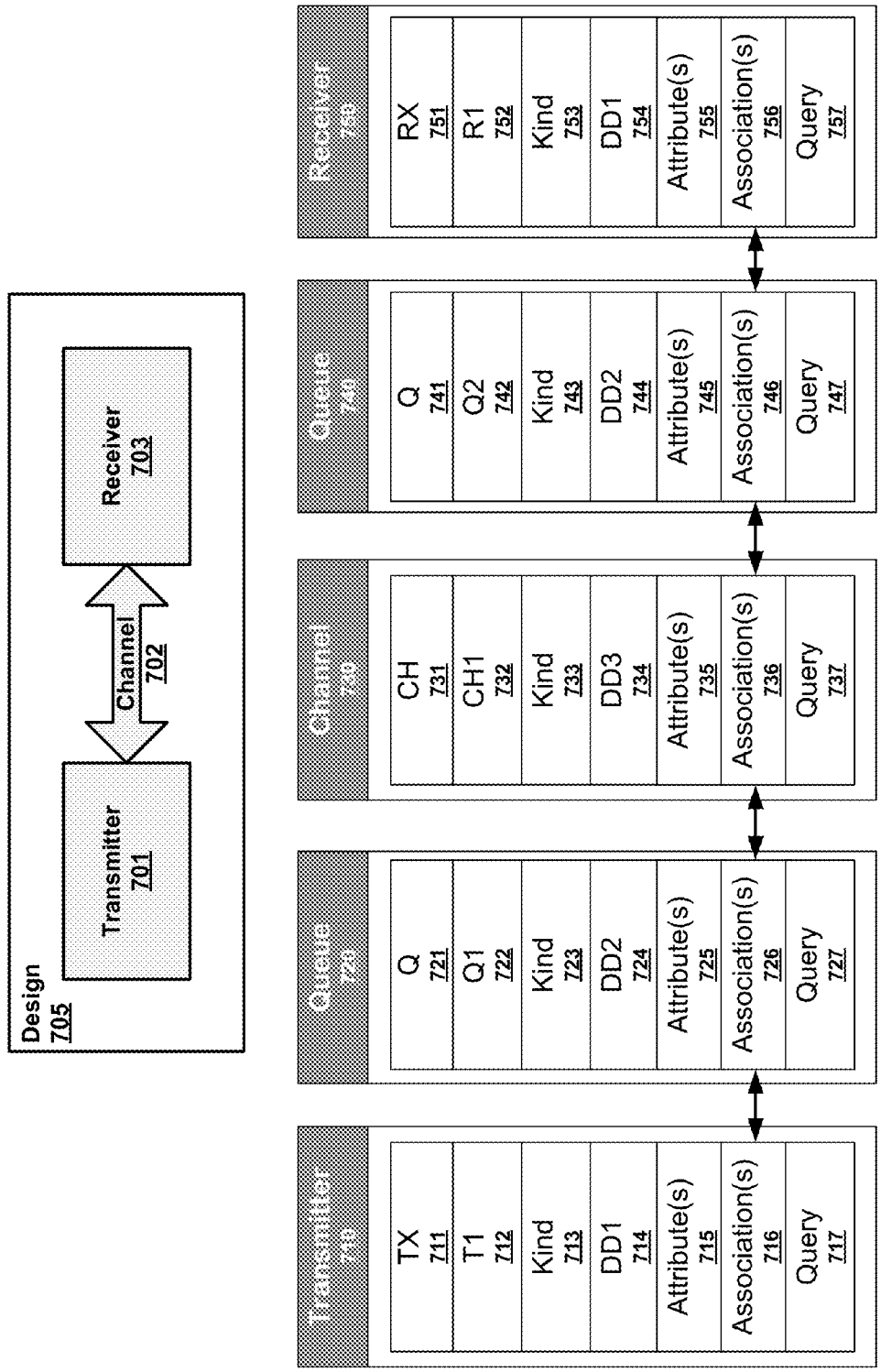
FIG. 7 illustrates an exemplary set of records for abstract verification of objects in an exemplary design.

FIG. 7 illustrates an exemplary set of records for abstract verification of objects in an exemplary design 705. As shown in FIG. 7, an exemplary design includes a transmitter 701 and a receiver 703 connected via a channel 702. In the exemplary design, the transmitter 701 and receiver 703 represent any two design components that communicate via a channel. Similarly, the channel 702 represents any communication medium that may be used to transmit signals between the devices 701, 703.

For transmitter 701, a transmitter record 710 may be created. The record 710 includes an ID for the type of object being represented 711, an instance ID 712 unique for each object in the design, a kind code 713, an associated display definition 714, pointers to attribute records 715 for the transmitter object, pointers to association records 716 for the transmitter object, and any queries 717 related to the transmitter object. Similarly, a record with similar fields is created for each object in the design, including a record for each queue or buffer located at each of the transmitter 701 and receiver 702 (queue records 720 and 740 respectively) as well as a channel record 730 and a receiver record 750. As shown, each object has at least one association with the object each is connected to. Then during a run of the design, the object records will be used to track events related to each object. For example, the events recorded in the history table may include the creation or destruction of an object, access of a new protocol instance, the assignment of a value to an attribute, the creation or dissolution of an association, etc. FIG. 8 illustrates an exemplary history table according to an embodiment of the present invention.

As shown in FIG. 8, a history table 800 contains a number of fields to record events that occur during a run of the IP verification and testing. The fields may include a unique identifier or ever increasing serial number 810 identifying the event, a time field 820 indicating the time during the run the recorded event occurred, an event kind field 830 indicating the type of information reported in the event record, for example, a record of an object begin event, an attribute assignment event, etc. The fields of the history table 800 may additionally include an owner definition identifier 840, an owner instance identifier 850, an owned definition identifier 860, an owned instance identifier 870, and a value 880 of a variable being edited during the event. For example, when setting an object's color to blue, i.e.: my_obj.color='blue', an associated record in the history table 800 will have an owner instance identifier (850) set with an ID representing my_obj, an owned definition identifier (860) representing the color attribute that is being assigned, and value (880) set to "blue".

For example, a simulation of hardware elements can be modeled using event-driven simulation. During the simulation, when a status or attribute of a component changes, the database will be updated to reflect the change in the object representing that component. Similarly, code that an IP provider has written may be run/implemented in an emulator, to verify that the coded circuitry will operate according to the specification or standard. In order to do this, an emulator will exercise the coded circuitry in numerous ways, to ensure that various input combinations do not result in erroneous or ambiguous results. These results will be recorded in the run history table as value changes for attributes of the associated objects defined to represent the circuitry elements.

Almost invariably, an emulation verification process fails to run properly the first time, as there are errors. In the context of a standard to be implemented, the expected outputs from the hardware design being emulated will be known from the standard. If there are bugs, then the outputs of the verification will not be the expected outputs. These discrepancies may be identified by a review of the data recorded in the run history for the associated objects via the provided display types.

Once a run has been executed and the history table 800 populated, queries of the stored information may then be implemented. For example, using both the owner instance identifier 850 and the owned definition identifier 860, this allows a quick query for the value of a specific attribute (whose attribute identifier 860 is known) of a specific object (whose instance identifier 850 is known). As an example of a search using both the owner instance ID 850 and the owned definition identifier 860, for a queue named UserQ having packet objects, where the UserQ instance identifier and the object identifier for a packet are used, the query will return all relevant entries in the history table 800 using this search criteria ending with all the times any packet entered or exited the UserQ. Additionally, as an example of a query using both the owner definition identifier 840 and the owned instance identifier 870, for a specific packet, the query can identify all the times the specific packet entered and left any object of type queue.

Figure 9:
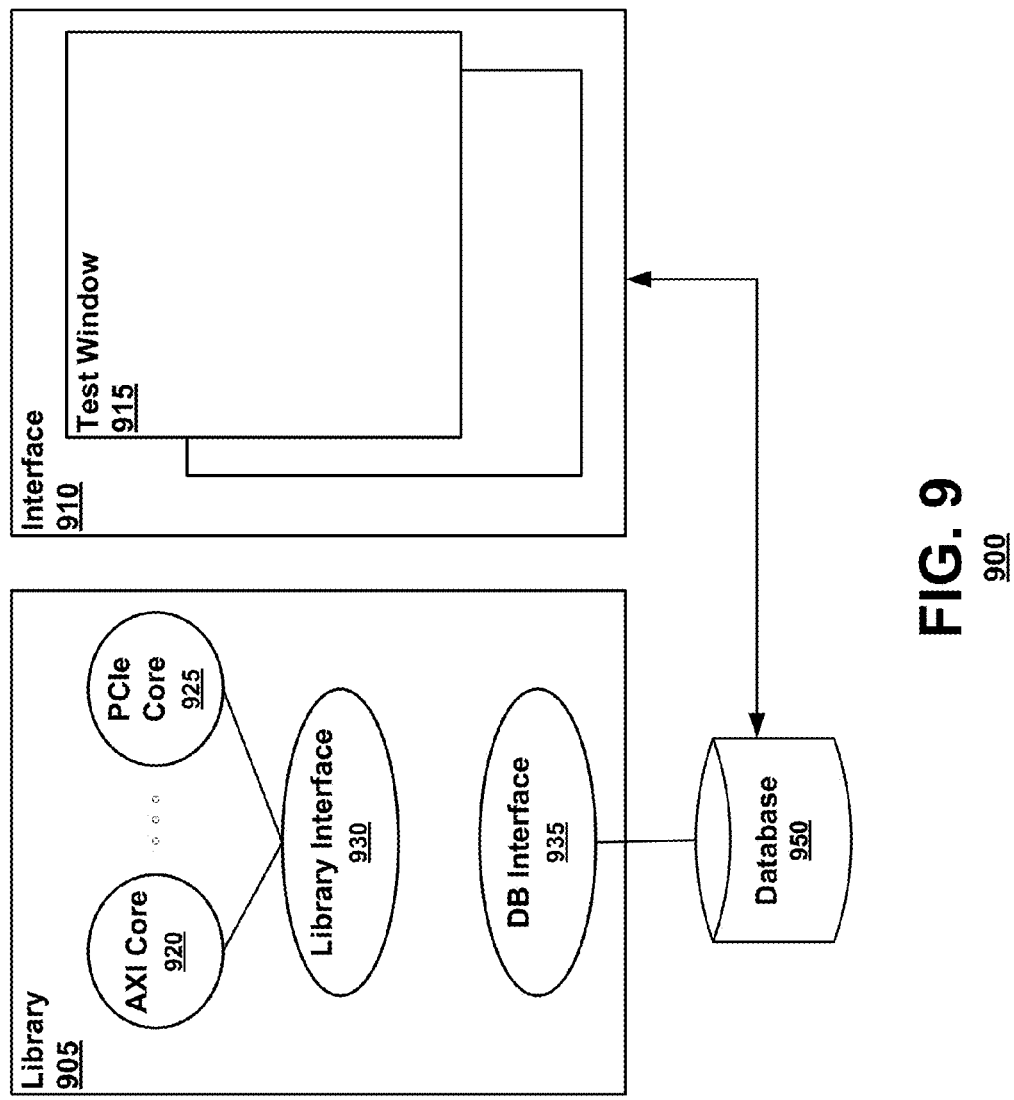
FIG. 9 is a simple block diagram illustrating components of an exemplary system according to an embodiment of the present invention.

FIG. 9 is a simple block diagram illustrating components of an exemplary system 900 according to an embodiment of the present invention. In FIG. 9, the exemplary system includes a library 905 and an interface 910. The interface 910 may include one or more windows 915 that display the results of the verification of the hardware design. Such windows may also display updates that occur during runtime to the objects representing the components of the design.

The library 905 includes one or more standard cores 920-925 that define the objects that will be implemented during simulation to test a hardware design for compliance with a specification or standard. The library 905 also includes a library interface 930 that defines the interface between a conventional verification platform and the standard cores 920-925. In FIG. 9, the library 905 additionally includes a database interface 935 that defines the interface between the library 905 and a database 950. The database 950 may contain the designs being tested, the conventional simulation processes, and any other information needed to verify and test the hardware design.

According to an aspect of the present invention, the verification platform provides verification of a hardware design regardless of the availability of the source code for each element of the design by describing the design content as objects. As described herein, the verification platform will contain object definitions that enable verification of one or more standards, e.g., Bluetooth™, WiFi, PCIe, AXI3/4, other communications, memory management, display, or other functionality. The verification platform then provides tools for design analysis through the interface.

Figure 10:
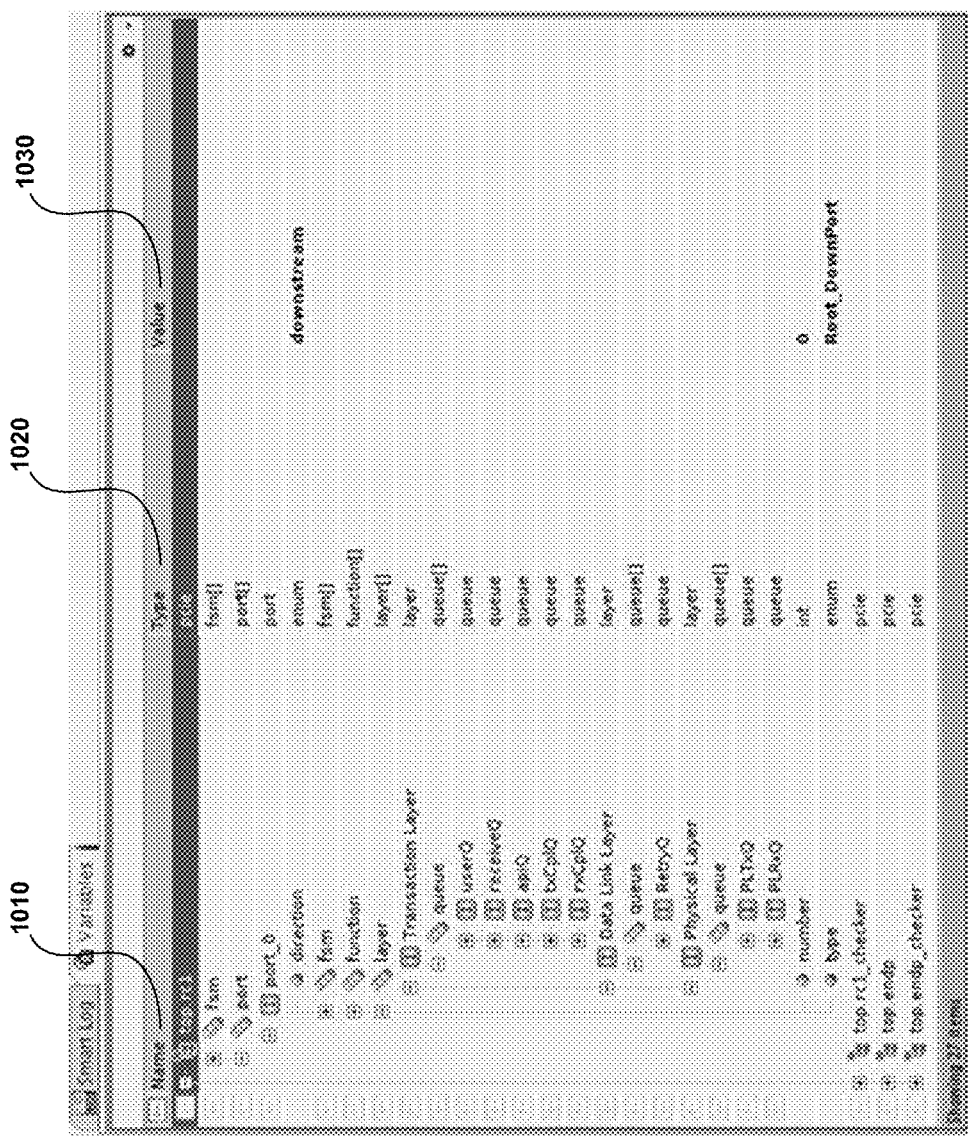
FIG. 10 illustrates an exemplary interface displaying an object hierarchy view according to an embodiment of the present invention.

Verification results may be displayed in the interface in a variety of ways. For example, a static or dynamic hierarchy may be displayed for the objects in the design. FIG. 10 illustrates an exemplary interface displaying an object hierarchy according to an embodiment of the present invention. As shown, the interface displays a hierarchy of all the instances in the run and the value of the attributes and associations of each object at a specific time of the run. As shown in FIG. 10, within the interface, a display 1000 may include a list of the objects 1010 in the design arranged in a logical hierarchy including attributes of the objects, a kind or type identifier for each listed item 1020, and the value 1030 of any item that was set at the time of the display. A user may select a time during the run for which to display the hierarchy or step through the events to view the status of the hierarchy at different stages.

Figure 11:
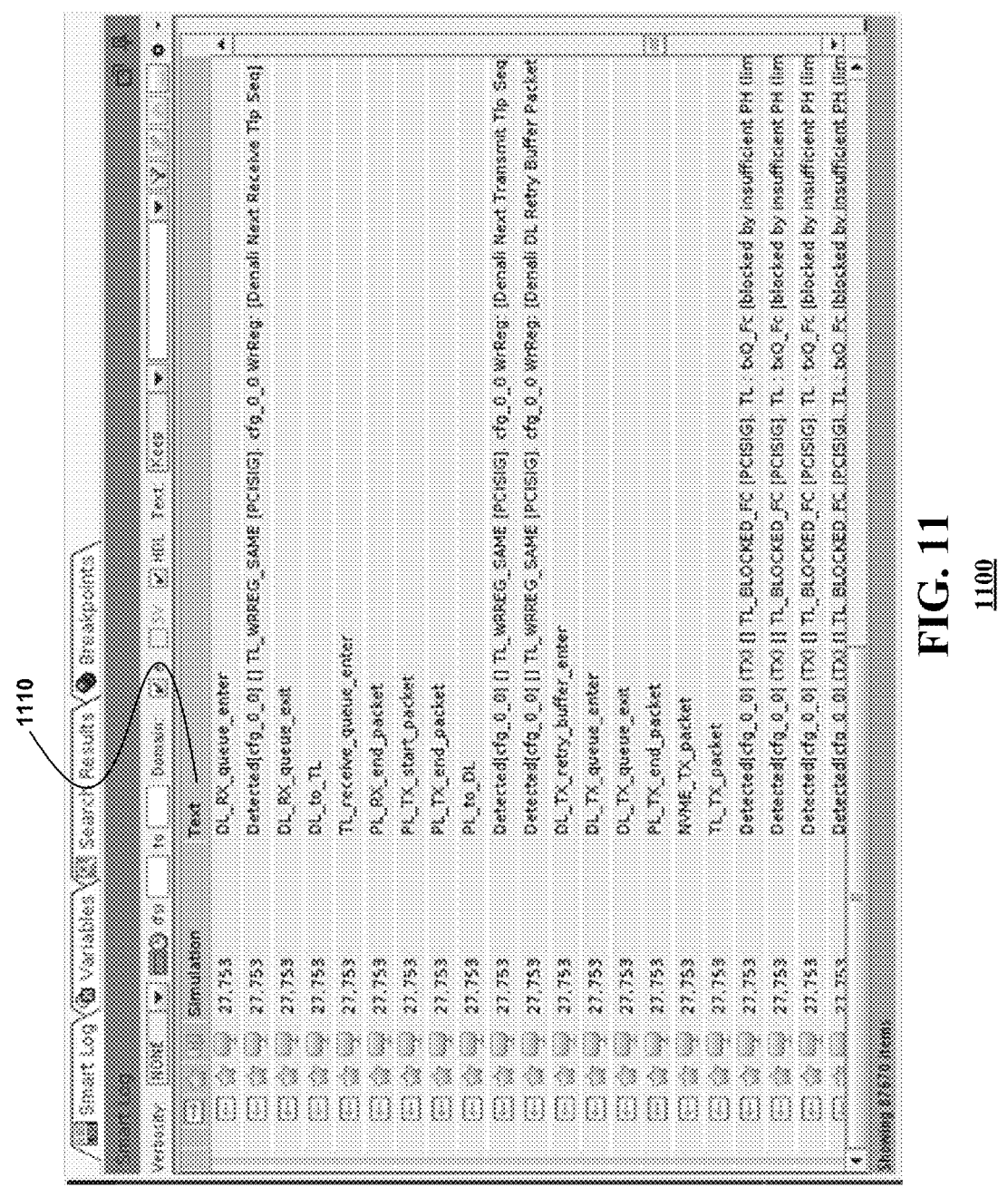

FIG. 11 illustrates an exemplary interface displaying a log view according to an embodiment of the present invention. As shown in FIG. 11, within the interface, a display 1100 may include a log displaying objects of the design according to a search. For example, the user could search for all packets or all callbacks, or could search by object type and display all queues. The user could also search for a specific object, for example, packets having a specific address or value, state machines with a specific state, etc. Within the interface, a display 1100 may include a list of the objects in the design matching the search criteria, the time during the run the event was recorded, a description of the event 1110 or other relevant information.

When an object is listed or displayed within the interface, the user can select the object and then select a different display for that object. For example, the user could right-click on an object listed in the hierarchy view of FIG. 10 and a list of display types available for the object will be shown. Then the user can select one or more of the available object-specific display types to view.

Figure 12:
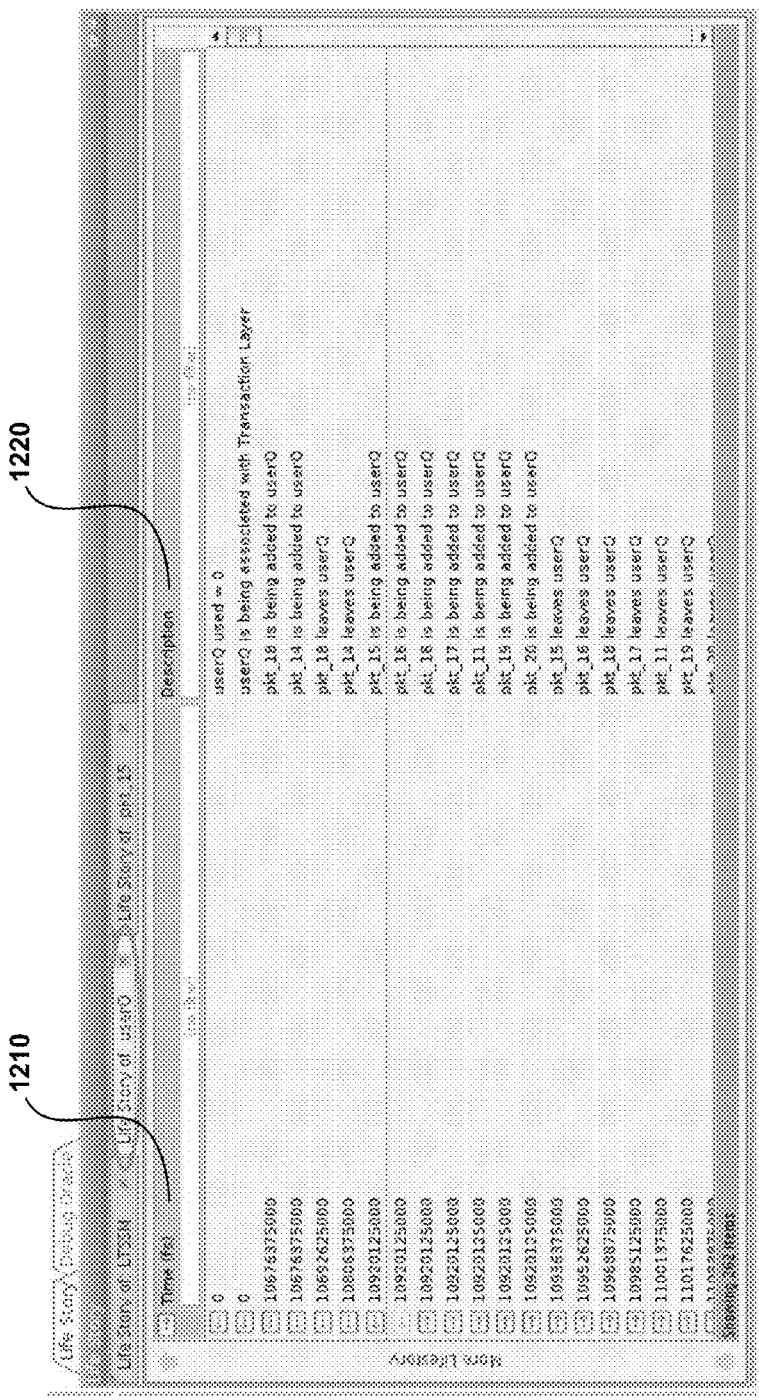
FIG. 12 illustrates an exemplary interface displaying a life story view according to an embodiment of the present invention.

Object specific display types may include a life story view, an event list view, a state machine view, a histogram view, a waveform view, or other display. FIG. 12 illustrates an exemplary interface displaying a life story view according to an embodiment of the present invention. The life story view displays the events related to the object during the course of the run. In the life story view, the display includes the abstract events relating to that object, for example, when an attribute of the object changed, when another object become associated with the object, when an association ended, when the object became associated with another object, etc. The life story view for different object types may be different. For example, for an FSM, the life story view will primarily display the state of the FSM as it changes. For a queue, the life story view will primarily display the packets entering and leaving the queue. For a packet, the life story view will primarily display information about the packet entering and leaving queues and how the attributes of the packet changed. Such a display type may only be available to objects of certain predefined types, for example, state machines, packets, queues, etc.

As shown in FIG. 12, within the interface, a display 1200 may show a list displaying the events that occurred for the object during the run. The list may include the time of the event 1210 and a description of the event 1220. To pull this information from the history table of the run, the system will identify the instance ID and the definition ID of the selected object. For example pktX has the definition ID of a packet and may have an instance ID of N. The definition of the protocol may define the packet type as an object without a time related attribute, may indicate that there is no object that may be contained in the packet, and that two object types that are associated with the packet object, e.g. a queue object and a callback object, may contain a packet. Then the system could query the database to identify all the entries in the database where the owner instance ID is N and the owned definition ID is the definition ID of an attribute of a packet, i.e. to identify all attributes of the packet instance. Another query may pull entries where the owner definition ID represents a queue and the owned instance ID is N, and a similar query where the owner definition ID represents a callback object, i.e., to identify all objects containing pktX.

Figure 13:
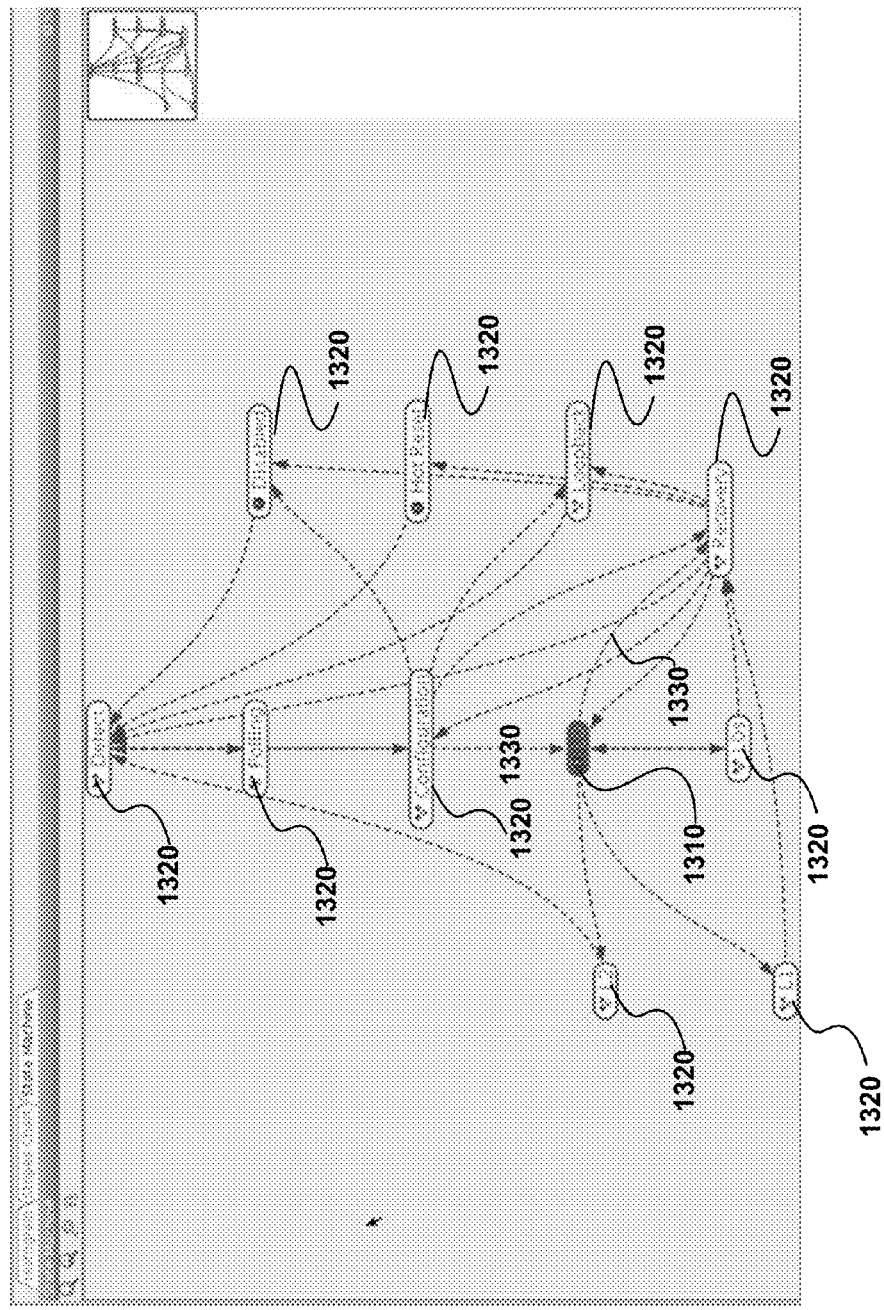
FIG. 13 illustrates an exemplary interface displaying a state machine view according to an embodiment of the present invention.

FIG. 13 illustrates an exemplary interface displaying a state machine view according to an embodiment of the present invention. The state machine view displays a map 1300 of a finite state machine object including the current state 1310, the previous or upcoming states 1320, and the immediately previous and immediately following edges 1330. Within the state machine view, a user can step through the state changes. A related log display for the state machine (not shown) may also be visible in the interface that shows the time during the run of each state change and a description of the change. Such information may also be displayed when a user input device hovers over or selects a state in the diagram (not shown), or via another display technique.

Figure 14:
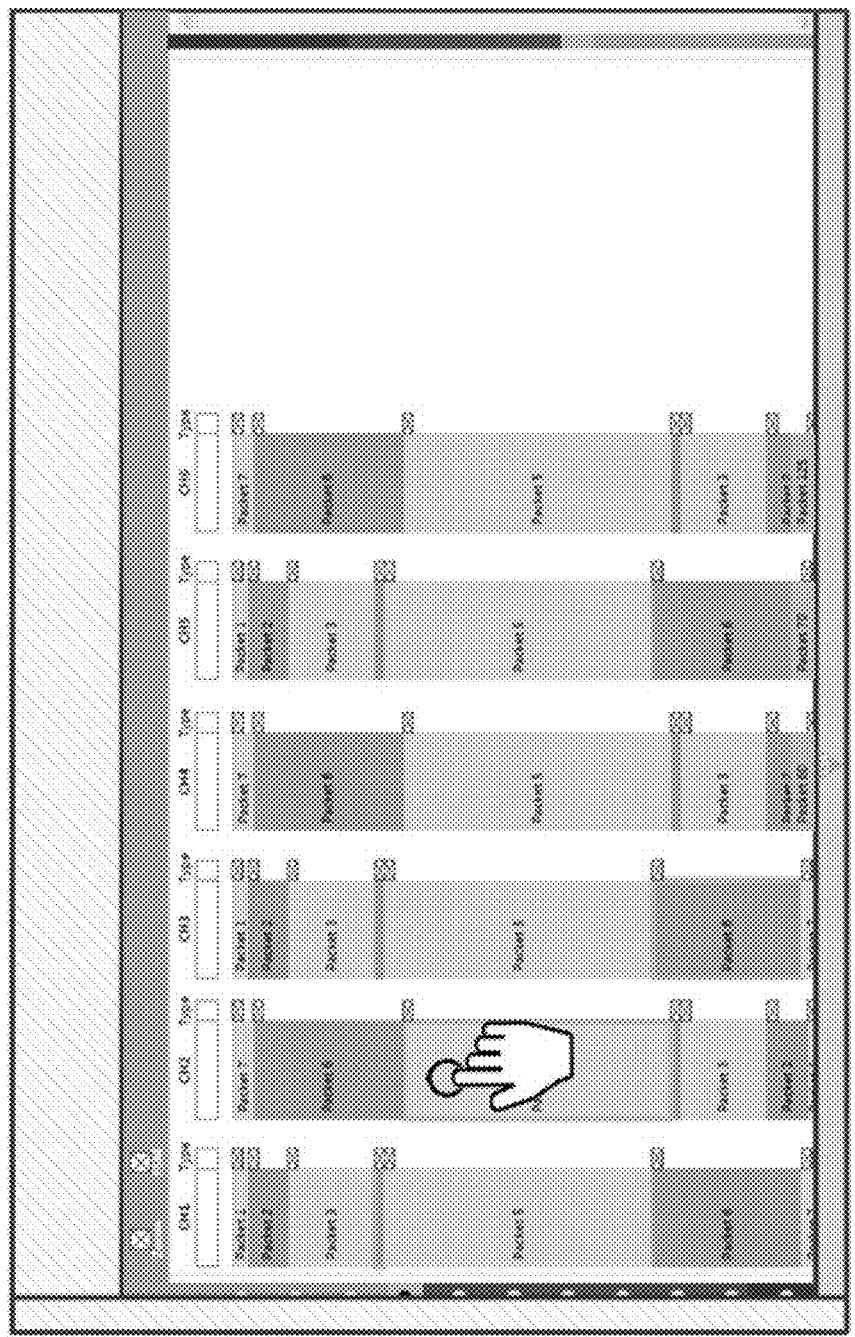
FIG. 14 illustrates an exemplary interface displaying a channel view according to an embodiment of the present invention.

FIG. 14 illustrates an exemplary interface displaying a channel view according to an embodiment of the present invention. The channel view displays state changes for a channel during the course of the run. For example, the channel viewer can show the traffic for a defined protocol, including information about the packets that are transmitted within each channel throughout the duration of the run.

Each protocol may additionally have a display file that could include instructions about which attributes of which objects should be displayed in the channel view. For example, for a PCI Express protocol, the state of the link training and status state machine (LTSSM), the associations between a receiver and packets, and the associations between a transmitter and packets should be displayed in a channel view.

Figure 15:
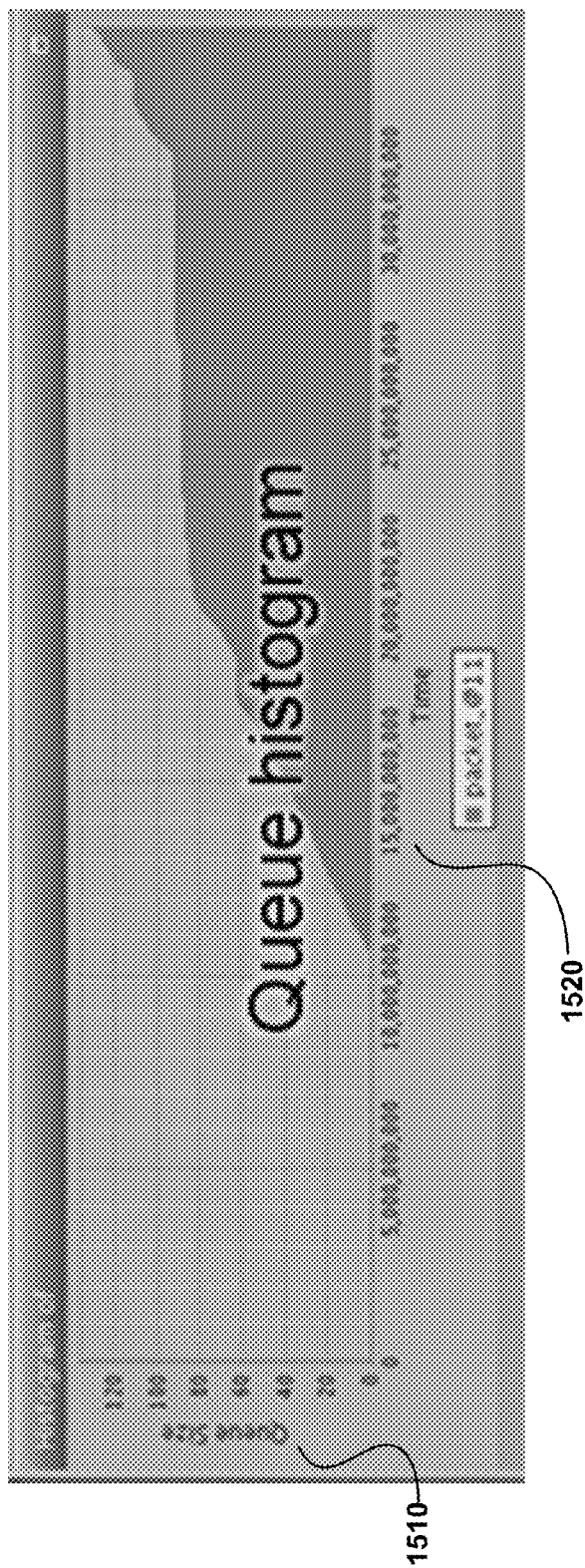
FIG. 15 illustrates an exemplary interface displaying a histogram view according to an embodiment of the present invention.

FIG. 15 illustrates an exemplary interface displaying a histogram view according to an embodiment of the present invention. The histogram view displays the size of an object or attribute as it changes throughout the run. Such a display type may only be available to objects of certain predefined types, for example, queues. In the histogram view, a user can select a specific time during the run and see the size of the object at the selected time and potentially the contents of the object, e.g., the packets in the queue at the selected time. As shown in FIG. 15, within the interface, a display 1500 may include a chart displaying the size of the queue 1510 at different times in the run 1520.

Figure 16:
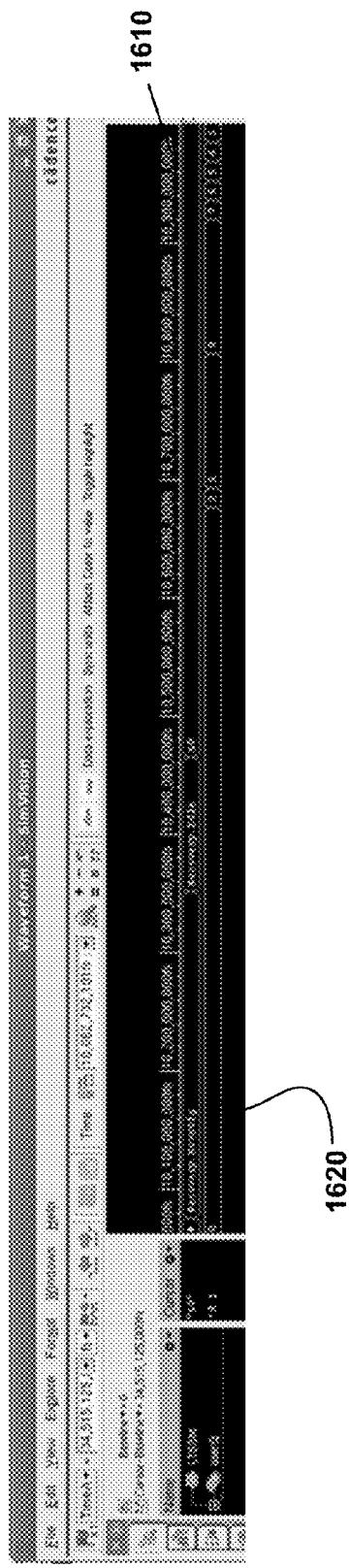
FIG. 16 illustrates an exemplary interface displaying a waveform view according to an embodiment of the present invention.

FIG. 16 illustrates an exemplary interface displaying a waveform view according to an embodiment of the present invention. The waveform view displays the values of an item during the run as a waveform. Such a display type may only be available to items of certain predefined types, for example to display the value of an attribute or the size of a queue. As shown in FIG. 16, within the interface, a display 1600 may include the time during the run of the waveform value 1610 and a waveform illustrating the value changes 1620.

A user may select an attribute or object to display in a waveform view. For example, a waveform view may be used for a state attribute of an FSM. Then the system can pull information from the history table about all the times where the attribute changed state and display the changes in a waveform. Similarly, the waveform view can be used to view the size of a queue as it changes during the run. Then the system pulls all the entries from the history table reporting an association between the queue instance and any packet by querying for the instance ID of the queue as an owner instance ID and for the definition ID of a packet object as the owned definition ID. Then a count is determined for packets entering and exiting a queue and is displayed over time for the duration of the run.

Although multiple different display types have been described, additional display types may be available. For example, a display type may compare objects and identify differences between them. This may be of particular use to compare an object with itself at another time during the run. Additionally, each of the described display types may be adjusted according to the instructions provided in a display definition associated with the objects being displayed or a display definition may provide instructions for user defined display types. Alternatively, the display type may be altered by other mechanisms. For example, user inputs during the verification process may define or alter a display type.

Figure 17:
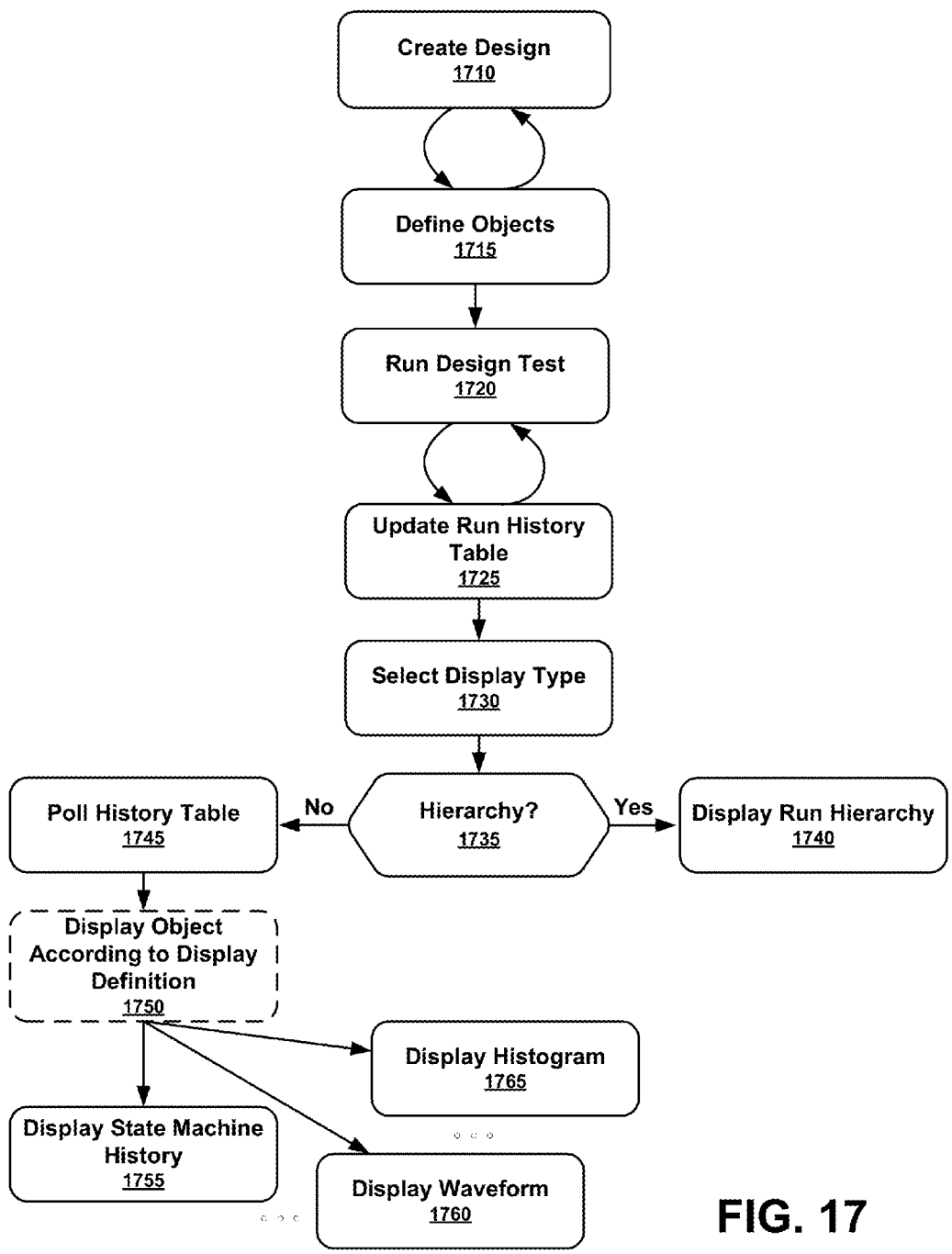
FIG. 17 illustrates an exemplary method for testing a hardware design with an object-oriented abstraction of the components in the design according to an embodiment of the present invention.

FIG. 17 illustrates an exemplary method for testing a hardware design with an object oriented abstraction of the components in the design according to an embodiment of the present invention. As shown in FIG. 17, a hardware design is created (block 1710). During the design process, or after the design has been completed, components of the design are expressed as objects according to an object-oriented definition of one or more specified standards implemented by the design (block 1715). The objects may be stored in a database for access during testing.

Then one or more tests of the design may be executed (block 1720). During the test, the run history table will be updated to capture the actions performed on the objects during the test (block 1725). A user may choose to view the run, or the results of the run, via one of the available display types (block 1730). Then, if the selected display type is for a hierarchy (block 1735), the run hierarchy will be displayed (block 1740). However, if the selected display type requires run information for one or more objects, the history table may be polled to pull the relevant information (block 1745). Then, the display definition associated with the relevant objects may be accessed to properly display the information related to the object (block 1750). Then a display type may be displayed on an interface according to the instructions in the display definition and the information pulled from the history table. As described above, exemplary run displays include a state machine history view (block 1755), a waveform view (block 1760), a histogram view (block 1765), etc. Then another verification process may be executed, the design tested, and the errors debugged until the hardware designer is satisfied with the verification of the hardware design.

According to an aspect of an embodiment, during the execution of the run or after the run has been completed, one or more display types may be viewable. One or more views may be set by default or be chosen by the user. Then the user can select a period in time, an object, a state, etc., in one display type and a corresponding time, object, state, etc. may be displayed in another display type. For example, a user could view or switch between both a state machine history view and a hierarchy view for the run. If the user then steps through the state machine history view, upon each state change the corresponding hierarchy view may change to show the hierarchy as it existed at the time of the new state.

In the case of IP that is designed to provide particular functionality, but in accordance with a proprietary design or feature set rather than a standard, outputs of the design will be a proprietary function of the inputs. An IP provider may be able to provide a custom protocol consisting of design-based sets of inputs and corresponding outputs, making it possible to exercise the design through a selection of various combinations of inputs without revealing proprietary aspects of the IP design component. An object-oriented definition of the IP component may then be created based on the custom protocol.

In accordance with one aspect of the invention, an EDA manufacturer may receive custom protocols and make them part of appropriate EDA software, be it verification IP, a test bench, or some other EDA software. In some instances, the EDA manufacturer may be able to generate and/or implement the object-oriented definition of the custom protocol on its own. In general, in accordance with an aspect of the invention, custom protocols for third party IP can be generated without revealing the provider's proprietary information. Because the hardware designer will not have direct access to the custom protocols, the designer is not privy to the IP provider's proprietary information.

In the foregoing discussion, there have been references to verification and test as well as to simulation, debugging, emulation and post-silicon analysis. Ordinarily skilled artisans will understand that the techniques described herein are applicable to all aspects and phases of the verification process.

In some applications, the modules described hereinabove may be provided as elements of an integrated software system, in which the blocks may be provided as separate elements of a computer program. Some embodiments may be implemented, for example, using a non-transitory computer-readable storage medium or article which may store an instruction or a set of instructions that, if executed by a processor, may cause the processor to perform a method in accordance with the embodiments. Other applications of the present invention may be embodied as a hybrid system of dedicated hardware and software components. Moreover, not all of the modules described herein need be provided or need be provided as separate units. Additionally, it is noted that the arrangement of the blocks in FIG. 17 does not necessarily imply a particular order or sequence of events, nor are they intended to exclude other possibilities. For example, the operations depicted at blocks 1710 and 1715 or at blocks 1720, 1725, and 1730 may occur in an alternate order or substantially simultaneously with each other. Such implementation details are immaterial to the operation of the present invention unless otherwise noted above.

The exemplary methods and computer program instructions may be embodied on a non-transitory computer readable storage medium that may include any medium that can store information. Examples of a computer readable storage medium include electronic circuits, semiconductor memory devices, ROM, flash memory, erasable ROM (EROM), floppy diskette, CD-ROM, optical disk, hard disk, fiber optic medium, or any electromagnetic or optical storage device. In addition, a server or database server may include computer readable media configured to store executable program instructions. The features of the embodiments of the present invention may be implemented in hardware, software, firmware, or a combination thereof and utilized in systems, subsystems, components or subcomponents thereof.

While the invention has been described in detail above with reference to some embodiments, variations within the scope and spirit of the invention will be apparent to those of ordinary skill in the art. Thus, the invention should be considered as limited only by the scope of the appended claims.

We claim:

1. A computer-implemented method of verifying a hardware design, the method comprising:
generating, with a processor, an object representing a component of the hardware design, wherein the object is an instance of an abstract definition of the component, the abstract definition based on a protocol implemented in the hardware design;
storing the object in a memory;
testing, using the processor, the object to determine whether the component complies with the protocol implemented in the hardware design, wherein the testing effects a status change in the object;

updating, with the processor, a history associated with the object to reflect the status change in the object;

displaying run-time actions and results of the test, including updates to the object, according to instructions provided in a display definition associated with the definition of the object;

performing, with the processor, the run-time actions on the object; and verifying, with the processor, that the component complies with the protocol implemented in the hardware design based on the performed run-time actions.

2. The method of claim 1, wherein displaying the actions and results includes querying a database storing a history of events for the test.

3. The method of claim 1, wherein updating the object includes storing each status change for the object in a database.

4. The method of claim 1, wherein the display definition modifies a predefined display type.

5. The method of claim 1, wherein the display definition defines a new display type.

6. The method of claim 1, wherein the display definition is an XML document.

7. The method of claim 1, wherein the actions and results are displayed in an object hierarchy.

8. The method of claim 1, wherein the actions and results are displayed in a life story view for the object.

9. The method of claim 1, wherein the actions and results are displayed in a state machine map.

10. The method of claim 1, wherein the actions and results are displayed in a channel view for the specification.

11. The method of claim 1, wherein the test results are displayed in a histogram for the object.

12. A system for verifying a hardware design, the system comprising:

a memory device;

a display; and a processor, wherein the processor is configured to:

generate an object representing a component of the hardware design, wherein the object is an instance of an abstract definition of the component, the abstract definition based on a protocol implemented in the hardware design;

store the object in the memory device;

test the object to determine whether the component complies with the protocol implemented in the hardware design, wherein the test effects a status change in the object;

update a history associated with the object to reflect the status change in the object;

display, on the display, run-time actions and results of the test, including the updated object, according to instructions provided in a display definition associated with the definition of the object;

perform the run-time actions on the object; and verify that the component complies with the protocol implemented in the hardware design based on the performed run-time actions.

13. The system of claim 12, wherein displaying the actions and results includes querying a database storing a history of events for the test.

14. The system of claim 12, wherein updating the object includes storing each status change for the object in a database.

15. The system of claim 12, wherein the display definition modifies a predefined display type.

16. The system of claim 12, wherein the display definition defines a new display type.

17. The system of claim 12, wherein the display definition is an XML document.

* * * * *